(12) United States Patent
Lohr

(10) Patent No.: US 6,614,848 B2
(45) Date of Patent: *Sep. 2, 2003

(54) DEVICE FOR TRANSMITTING SIGNALS BETWEEN MOVING PARTS

(75) Inventor: Georg Lohr, Stephanskirchen (DE)

(73) Assignee: Schleifring und Apparatebau GmbH (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/068,884

(22) PCT Filed: Nov. 21, 1996

(86) PCT No.: PCT/DE96/02222
§ 371 (c)(1),
(2), (4) Date: Nov. 9, 1998

(87) PCT Pub. No.: WO97/19483
PCT Pub. Date: May 29, 1997

(65) Prior Publication Data
US 2002/0122497 A1 Sep. 5, 2002

(30) Foreign Application Priority Data

Nov. 22, 1995 (DE) .......................................... 195 43 559
Nov. 22, 1995 (DE) .......................................... 195 43 558
Feb. 1, 1996 (DE) .......................................... 196 10 628

(51) Int. Cl.[7] .............................. H04B 3/00; H04L 25/12
(52) U.S. Cl. ...................... 375/257; 375/219; 375/258; 333/24 R; 333/32
(58) Field of Search .............................. 375/219, 220, 375/222, 257, 258, 377; 333/17.3, 24 R, 109, 112, 124, 32, 222, 253, 256, 263

(56) References Cited

U.S. PATENT DOCUMENTS

| | | | | |
|---|---|---|---|---|
| 4,225,960 A | * | 9/1980 | Masters | 375/357 |
| 4,384,356 A | * | 5/1983 | Beerbaum | 375/219 |
| 4,399,413 A | * | 8/1983 | Bosselaers | 327/93 |
| 4,794,507 A | * | 12/1988 | Cavigelli | 363/86 |
| 5,061,910 A | * | 10/1991 | Bouny | 333/26 |
| 5,751,242 A | * | 5/1998 | Goutzoulis et al. | 342/157 |
| 5,799,248 A | * | 8/1998 | Vice | 455/333 |

* cited by examiner

Primary Examiner—Young T. Tse
(74) Attorney, Agent, or Firm—St. Onge Steward Johnston & Reens LLC

(57) ABSTRACT

Devices consisting of a signal source and a signal sink connected by a transmission channel for transmitting high-frequency signals, as well as digital signals between moving parts. By eliminating wave reflections, the signals are transmitted such that reliable wide-band transmissions are ensured.

13 Claims, 6 Drawing Sheets

DEVICE FOR TRANSMITTING SIGNALS BETWEEN MOVING PARTS

BACKGROUND AND SUMMARY OF THE INVENTION

The invention relates to devices for transmitting, high-frequency as well as digital signals between moving parts, consisting of a signal source and a signal sink connected by a transmission channel. Specifically, the present invention relates to the transmission of high-frequency signals such as intermediate-frequency signals or even digital data, rather than high-performance transmission in the microwave range. Such signals are normally made available as non-symmetrical signals.

High-frequency and also digital signals must frequently be transmitted between parts which are mobile relative to each other. A typical application of such transmission paths is radar technology, where signals are transmitted from the transmitter/receiver unit to the antenna.

Various devices are known for transmitting non-symmetrical signals. For instance, the transmission may be performed in a capacitive manner via a package of plates resembling a variable capacitor. The main problem of this arrangement is the current path between the mutually mobile parts is not precisely defined. Initially, the current flows through the plate package. The return path is normally the frame or chassis, which is mostly implemented as a screen or housing. When the parts are rotating relative to each other, however, it is particularly difficult to achieve an effective low-inductance frame or ground connection. This results in the inherent problems with the previous transmission systems. In this case, it is very difficult to achieve constant transmission characteristics and a constant cross-talk.

Even though transmission paths implemented with the aid of variable capacitors have a comparatively large bandwidth, in distinction from other transmission techniques, they present the disadvantage of high engineering expenditures (in terms of the plate packages) and an upper limit frequency which is far below a wavelength corresponding to the dimensions of the plate package. Another disadvantage of this arrangement is their high sensitivity to mechanical loads as well as shocks and vibrations.

Transmission paths based on coupled resonance circuits present good transmission characteristics, but naturally they only have a very narrow band. They have high expenditure requirements (in terms of manufacturing technology), and may possibly require trimming. For different applications, each of these elements must be dimensioned differently. As a result, it is nearly impossible to obtain a wide range of products with such transmission paths in a standard design.

In order to avoid the disadvantages of these arrangements, several approaches have been tried to improve the high-frequency transmission characteristics of conventional collector rings. One such approach involves a method of simultaneously inputting the signals at several locations so that the occurrence of resonances at elevated frequencies is ensured during limited operating conditions. In another approach, attempts have been made to configure a slip ring with a defined wave resistance and to terminate it with the wave resistor at a suitable location.

Both approaches are entirely unsuitable for broad-band high-frequency transmission because they begin from a closed annular contact path. This path will always be a capacitive load. Even when a resistor is mounted, which corresponds to the wave resistor, a closed ring can never be designed to be free of reflections. With reference to FIG. 4 and FIG. 5, the explanation for this is as follows.

FIG. 4 shows a closed ring which is designed with a wave resistor of $Z_o=50'\Omega$. An impedance 15 with $R=50'\Omega$ is mounted on this wave resistor. FIG. 5 shows a small segment of the ring including the impedance. On the assumption that the ring is actually terminated, and free of reflections, a wave propagating along the direction would encounter an impedance ahead of the impedance 15. This is the result of mounting in parallel the real resistor (with $R=50'\Omega$) and the line (with $Z_o=50'\Omega$) for the purpose of continuing conduction behind the resistor. The value of the parallel circuit is $25'\Omega$. As a result, the line cannot be free of reflections for the wave ahead of the resistor. Even with all other combinations of wave resistors and terminating resistors, a line free of reflections is unobtainable.

The previously described non-contact transmission methods are superior to the contacting methods, because they contain a negligible amount of mechanical friction and hence a lack of abrasion or contact wear. The service life of such non-contact transmission systems is essentially longer than that of the contacting methods. This is particularly true in the case of high speeds in the relative motion of the moving parts. Nevertheless, these transmission methods have the inherent disadvantage of a frequency limit that is lower. As a function of the particular design, this limit may vary. What is characteristic, however, is the fact that a common-mode component with a frequency of 0 (zero) cannot be directly transmitted.

The digital signals occurring in practical industrial application, e.g. the signals used in advanced bus systems, vary between almost static signals with extremely low frequencies and signals with a maximum clock rate predetermined by the bus system. The lowest frequencies occurring are mostly below the lower limit frequency of the previously described non-contact transmission systems.

Hence a direct transmission of these signals is, as a rule, not possible. The known modulation or coding methods are a remedy in this respect. Both methods require high engineering expenditures. The coding methods which are well suited for digital signal transmission, such as the Manchester coding approach, require a wider bandwidth of the transmission channel merely on account of their coding. As a result engineering expenditures and costs of the transmission path are increased. Moreover, regeneration of the digital signal's timing is required in the majority of coding applications. This timing is frequently unreconstructable from the signal. Only with a suitable data structure, is timing regeneration possible via PLL elements. Such circuits are mostly suitable for a previously determined data rate. In the event that the non-contact transmission path should be transparent in terms of data and protocol, only the expensive modulation methods can be employed.

The object of the present invention is to improve a device for transmitting signals between mobile elements consisting of a signal source and a signal sink connected by a transmission channel such that a reliable wide-band transmission is ensured. This is accomplished without a frame or ground connection being required between the moving parts.

A further object of the present invention is to provide devices that are suitable for transmitting high-frequency signals and/or digital signals. Moreover, according to the object of the invention, a transmission that is transparent in terms of protocol and data, with a data rate lower than the lower limit frequency of the transmission path for the transmission of digital signals should be possible with low engineering expenditures and without an increased bandwidth requirement.

These and other objects and advantages are achieved by the present invention device, in which a signal source and a signal sink are connected by a transmission channel such that the transmission path has a symmetrical structure and hence a precisely defined current path is available. The current paths for emission and return are obtained in approximately identical ways. Therefore, the signal flow must not be returned via another path which is poorly defined. Hence, poor frame or ground connections are irrelevant and a frame or ground connection may even be eliminated entirely. As a result, a separation of potentials of the parts that are movable relative to each other can be achieved at the same time. Moreover, due to the symmetrical transmission, an excellent in-phase rejection is achieved. This is particularly expedient, and is specifically true in those cases which involve poor ground connections between the moving parts such that substantial differences in voltage may be present between these elements.

In one embodiment of the invention, optional matching circuits are provided for a conversion of non-symmetrical into symmetrical signals and vice versa. Such matching circuits are necessary when the signal source, or even the signal sink operate, on non-symmetrical signals.

In another embodiment of the invention, the coupler means consist of two oppositely facing pairs of conductive surfaces. The conductor surfaces should be designed such that they are matched with the path of travel and the widest possible overlapping of the conductive surfaces will always be present on the moving parts. The individual conductor surfaces of each pair should be symmetrical as far as this is possible, in order to ensure the symmetry of the arrangement as a whole.

In a further embodiment of the invention, the matching circuits are implemented via passive components. For instance, several circuits are known for impedance matching and symmetry via lines and also via transformers are known. Here too, designs using other passive components are possible.

Another embodiment of the arrangement utilizes active components in the matching circuits. The functions of these matching circuits can be implemented by the use of semiconductors and integrated amplifiers without any additional problems. Moreover, the first matching circuit can be implemented via an amplifier having an inverting and a non-inverting output. Two separate amplifiers are, of course, equally suited for application. The second matching circuit can hence be implemented likewise via a differential amplifier.

In a yet a further embodiment of the present invention, transmission of digital information, a logic gate with an inverting and a non-inverting output are used in the first matching circuit. As before, two separate logic gates may equally be employed. The second matching circuit may be implemented by means of a logic circuit having a differential input.

In still another embodiment according to the invention, the broad-band signal transmission characteristics of a line terminated so that it is free from reflections is utilized. Such a line may be structured, in correspondence with the prior art, as a coaxial line, a strip line or as a symmetrical two-wire circuit. Actually, other types of lines are also suitable for guiding electromagnetic waves. The electromagnetic waves have a constant defined wave resistance over their entire length and are terminated on at least one end with a resistor that corresponds to the wave resistance such that they are free of from reflections. The essential aspect, however, is the transmission of TEM waves on electrical lines.

As a rule, such lines are terminated on both ends by the wave resistor. However, a signal source with a non-matched internal resistance may equally be connected to a line which, on its part, is terminated with a resistor that corresponds to the wave resistance such that it is free of reflections. Reflections cannot occur on the termination which is free of reflections. With a circular arrangement of such a line, in correspondence with the path of the rotating movement, the information may be obtained along the line.

In the embodiments reference is made to the term "line". In fact, this term relates to all lines and also several lines. The term "rotating" movement refers to a rotating motion over any angular range whatsoever, and hence even applies to limited angular ranges up to continuous rotating movements.

In a further embodiment of the present invention, the signals are "coupled out" of this line via a high-impedance output circuit. This high-impedance circuit therefore does not give rise to reflections at the output-coupling site. Such an output circuit may utilize a transformer, or even an amplifier with a high-impedance input or an impedance transformer.

In another embodiment of the invention, the signal is "coupled out" via a field probe. This probe may be both an E-field probe or an H-field probe. Moreover, the probe can even be a combination of both types and can be a second coupled line. What is essential in the design of the field probe is the fact that it will not influence the field of the line in a way which will create reflections on the line. An attenuation of the signal on the line by the probe is permissible, because any further reflections do not occur in this case.

In another embodiment of the present invention, signals may even be coupled into contact with the line. To this end, it is necessary to terminate the line on both ends in a form that is free of reflections, because waves propagate from the rotatable input site along both directions of the line.

In a further design signals are coupled into the line via a coupler element which achieves the coupling of the E-fields and/or the H-fields. In the simplest form this coupling element may be another line arranged in parallel with the first line.

In accordance with the object of the invention, the device is configured specifically for the transmission of digital signals, such that the transmitter is provided with a signal processing circuit which increases the slope of the signal flanks of the digital signal supplied by the data source. This permits the reciprocal values of the rise time and the drop time to be higher than the lower limit frequency of the transmission path. Furthermore, a logic evaluation circuit is provided in the receiver which reconstructs the original signals from the pulses supplied by the transmission path by differentiation of the signals emitted by the transmitter.

Other objects, advantages and novel features of the present invention will become apparent from the following detailed description of the invention when considered in conjunction with the accompanying drawings.

DETAILED DESCRIPTION OF THE INVENTION

Figure 1:
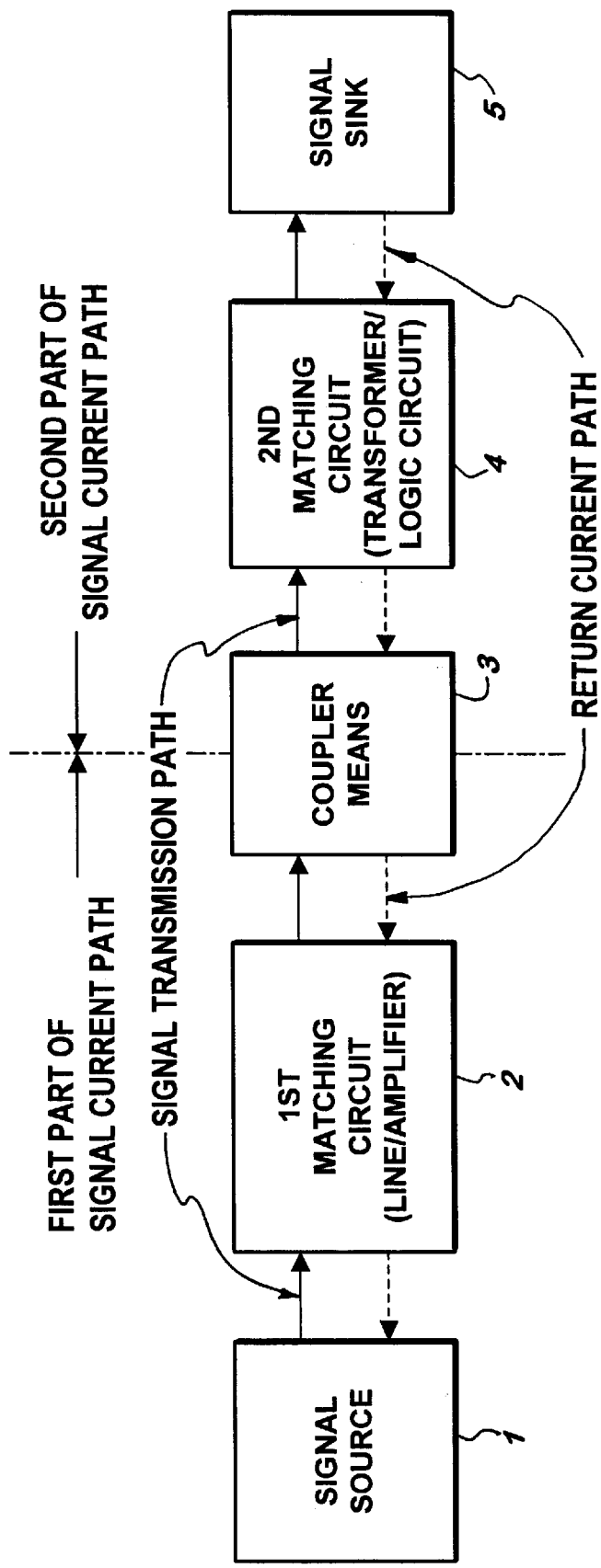
FIG. 1 is a block diagram illustrating an advantageous embodiment, of the present invention.

FIG. 1 shows an embodiment of the invention, which consists of a signal source 1 and a signal sink 5 connected by the first matching circuit 2, the coupler means 3 and the second matching circuit 4.

Figure 2:
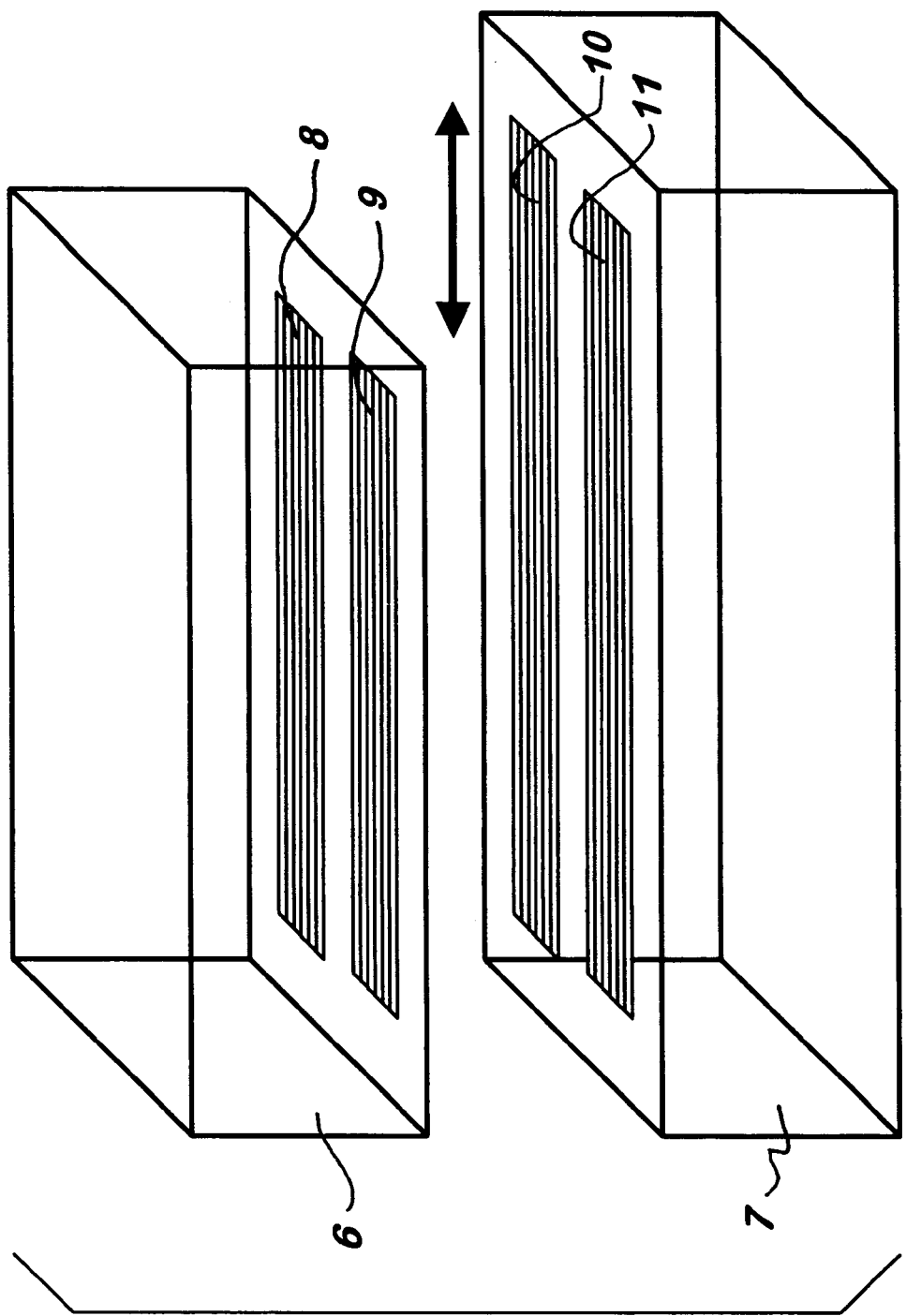
FIG. 2 shows a practical implementation of the coupler means, according to an embodiment of the invention.

FIG. 2 illustrates a practical implementation of the inventive coupler means. Two conductor surfaces 8 and 9 or 10 and 11, respectively, of approximately the same size are arranged via holding elements 6 and 7 or the two parts which may be moved relative to each other. The arrow indicates the principal direction of movement. With movements along this direction the quality of transmissions remains constant. With movements in all other directions, the quality of transmissions is subject to very strong variations.

Figure 3:
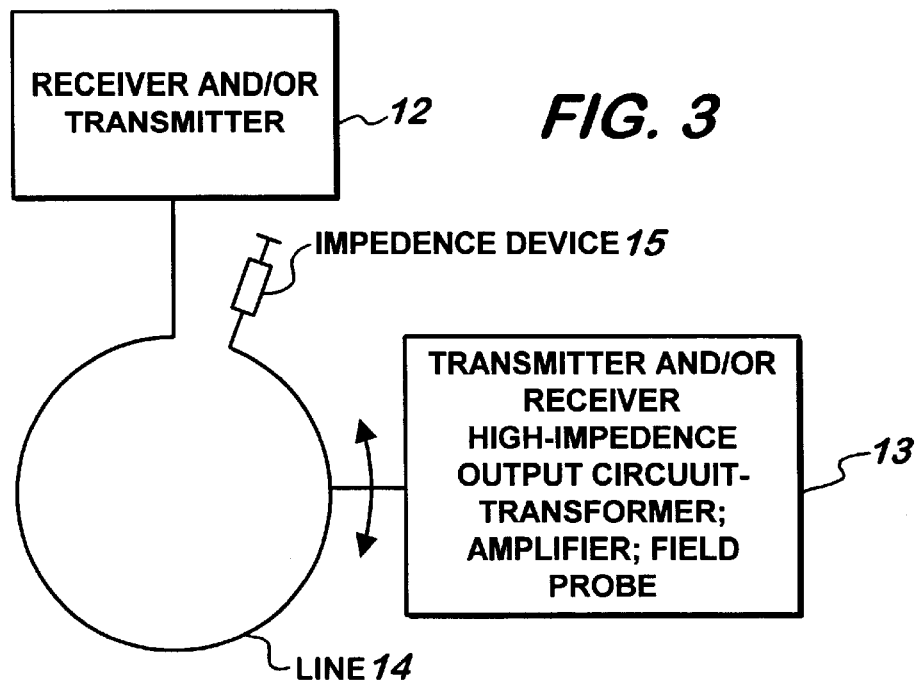
FIG. 3 is a schematic view of an embodiment, according to the invention.

FIG. 3 illustrates another embodiment of the invention. Here, a transmission path for signal transmission that consists of a receiver and/or transmitter 12, as well as a transmitter and/or receiver 13 for relative rotation is provided. The receiver and/or transmitter 12 and transmitter and/or receiver 13 exchange signals via a line 14 which is terminated by an impedance device 15 in correspondence with its wave resistance.

Figure 4:
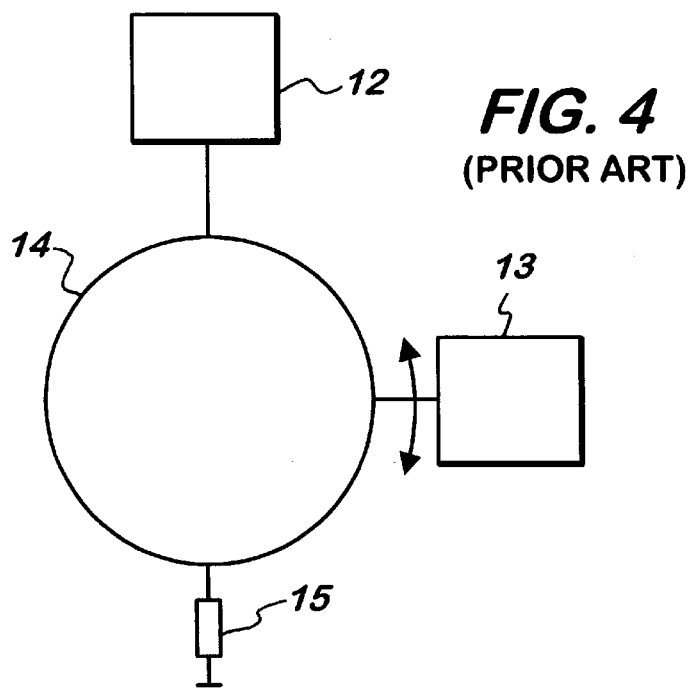
FIG. 4 shows a transmission system according to the prior art.

FIG. 4 shows an embodiment that corresponds to the prior art. It is composed of a transmitter and/or receiver 12 with a line 14 closed to form a ring. The ring is connected to a terminating resistor 15. The signals are transmitted to the receiver and/or transmitter 13 in relative rotation mostly by a galvanic contact with the line 14.

Figure 5:
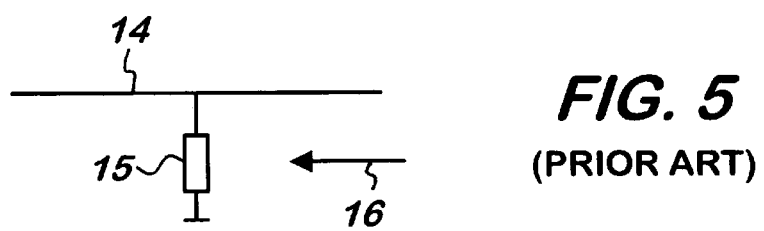
FIG. 5 is a detail of the illustration in FIG. 4.

FIG. 5 serves to explain the impedance situation in an embodiment according to FIG. 4 that corresponds to the prior art. On the assumption that the line ring is terminated in correspondence with its wave resistance, an electromagnetic wave which propagates along the direction 16 meets a parallel circuit that includes the impedances of the line ring 14 and the terminating resistor 15. The total impedance value is, in any case, smaller than the impedance of the line ring and hence provides for mismatching.

Figure 6:
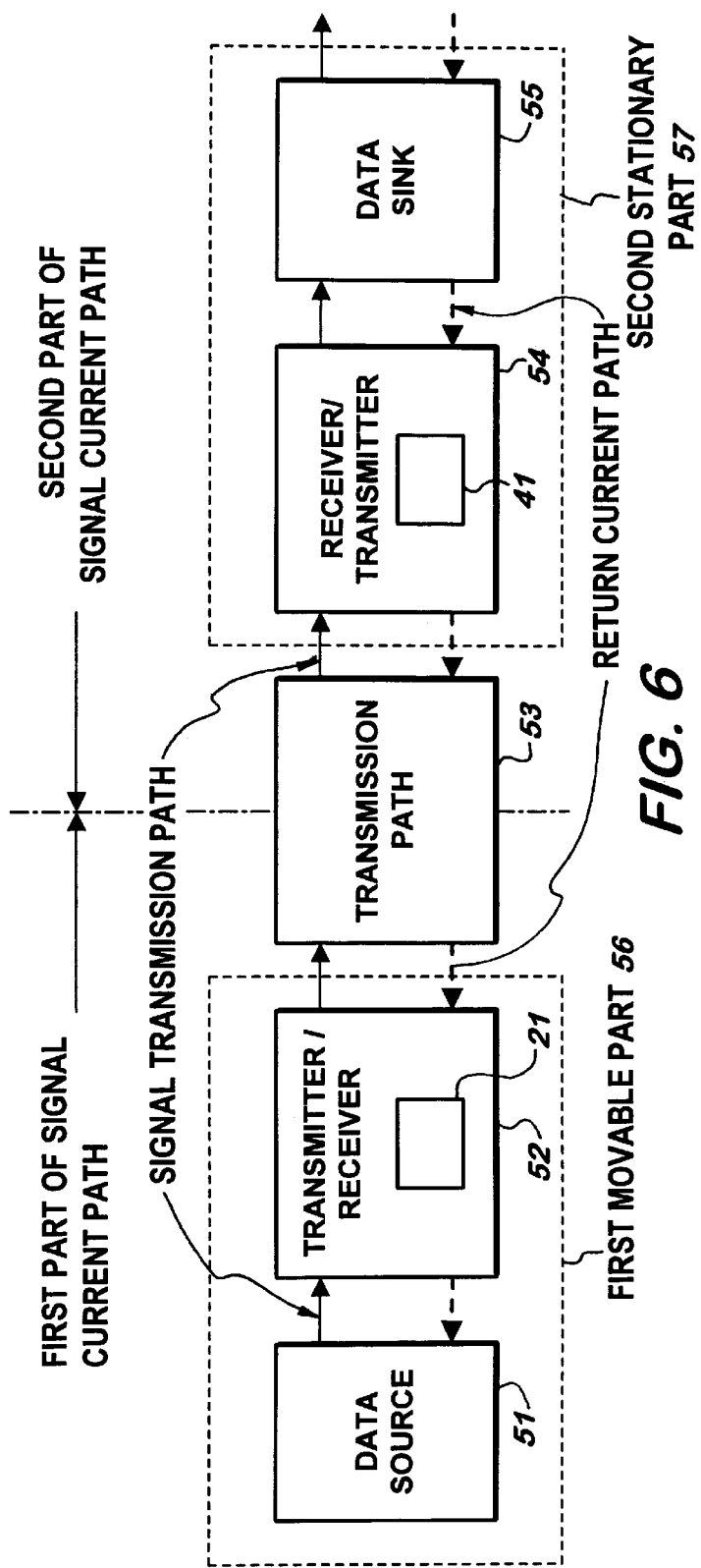
FIG. 6 represents a schematic arrangement of a transmission path according, to an embodiment of the invention.

FIG. 6 depicts one advantageous embodiment of the present invention where data is transmitted from the first movable part 56 to the second stationary part 57. FIG. 6 illustrates a data source 51 and a data sink 55 which are both interconnected via the transmitter/receiver 52, the transmission path 53 and the receiver/transmitter 54. The transmitter/receiver 52 includes a signal processing circuit 21 that ensures a minimum slope of the signal flanks. An evaluation circuit 41 is provided in the receiver/transmitter 54, which reconstructs the original signal from the signal, which has been distorted by the transmission path. Both data source 51 and transmitter/receiver 22 are located in first movable part 56, and data sink 55 and receiver/transmitter 54 are located in second stationary part 57.

The transmitter/receiver 52 is provided with a signal processing circuit 21. This circuit increases the flank slope of the digital signals furnished by the data source such that the reciprocal values of the rise and decay times are greater than the lower limit frequency of the transmission path. The signals processed in this manner are then emitted by the transmitter/receiver 52 to the transmission path 53. Because of the band-pass characteristic of the transmission path, only isolated pulses still arrive at the receiver/transmitter 54. The isolated pulses assume positive or negative values, depending on the flank emitted by the transmitter/receiver 52.

An evaluation circuit 41 is provided in the transmitter/receiver 54, which reconstructs the original signal from these pulses. The reconstructed signal is then transmitted by the receiver/transmitter 54 to the data sink 55. The evaluation circuit 41 comprises a first comparator for detecting negative pulses. A digital memory is set by the first comparator and reset by a second comparator. As a result, the polarity of the pulse that occurred last is stored. With the pulses occurring only at signal flanks, they are indicative of variations in the signal level. As these variations are stored, the output of this memory reflects the last signal level.

Figure 7:
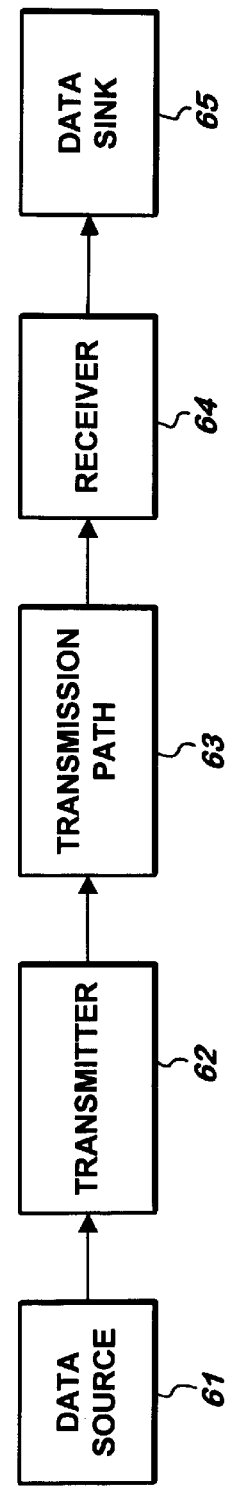
FIG. 7 is a schematic view of a transmission path according to the prior art.

FIG. 7 shows an embodiment that corresponds to the prior art. It consists of a data source 61, a transmitter 62, a transmission path 63, a receiver 64, as well as a data sink 65.

Figure 8:
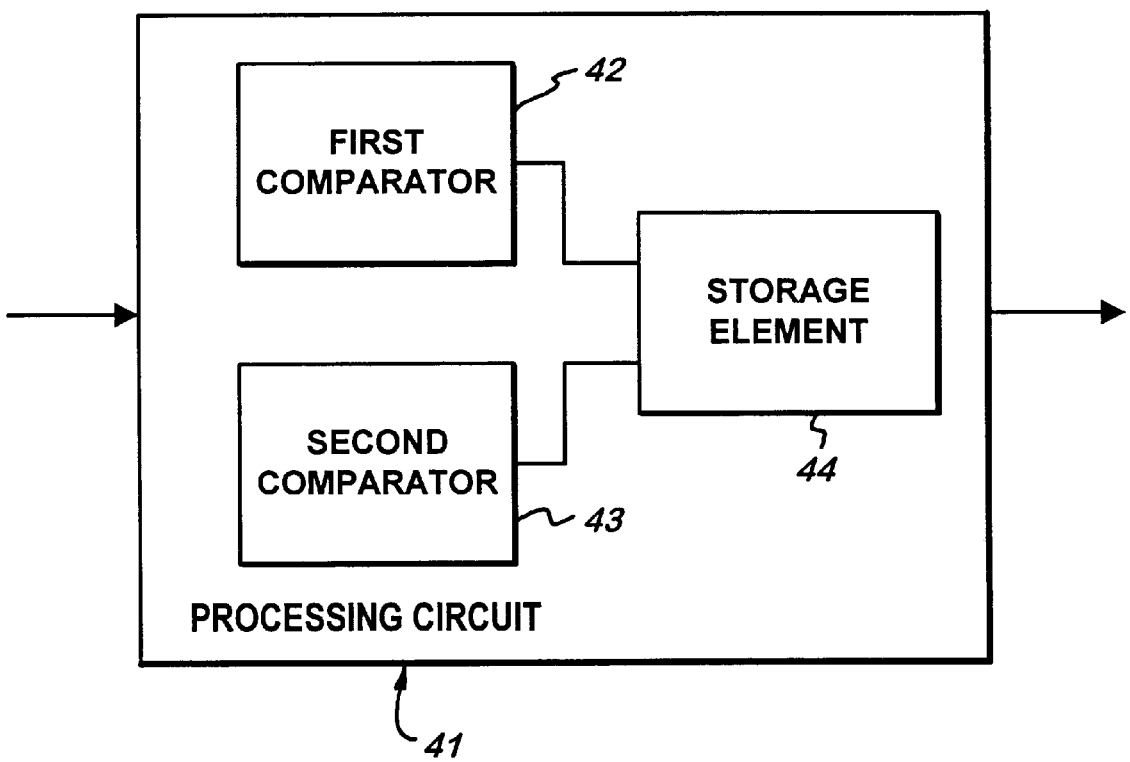
FIG. 8 shows a schematic view of the receiver unit according to the invention.

FIG. 8 illustrates a typical structure of the evaluation circuit 41. This circuit includes a first comparator 42 for detecting positive pulses, as well as a second comparator 43 for detecting negative pulses. A digital memory is set by the first comparator 42 and reset by the second comparator 43. Therefore, the polarity of the pulse that occurred last is stored. The output signals of the first and the second comparators are combined with each other via a storage element 44. With the pulses occurring only at signal flanks, they are indicative of variations in the signal level. As these variations are stored, the output of this memory reflects the last signal level.

Figure 9:
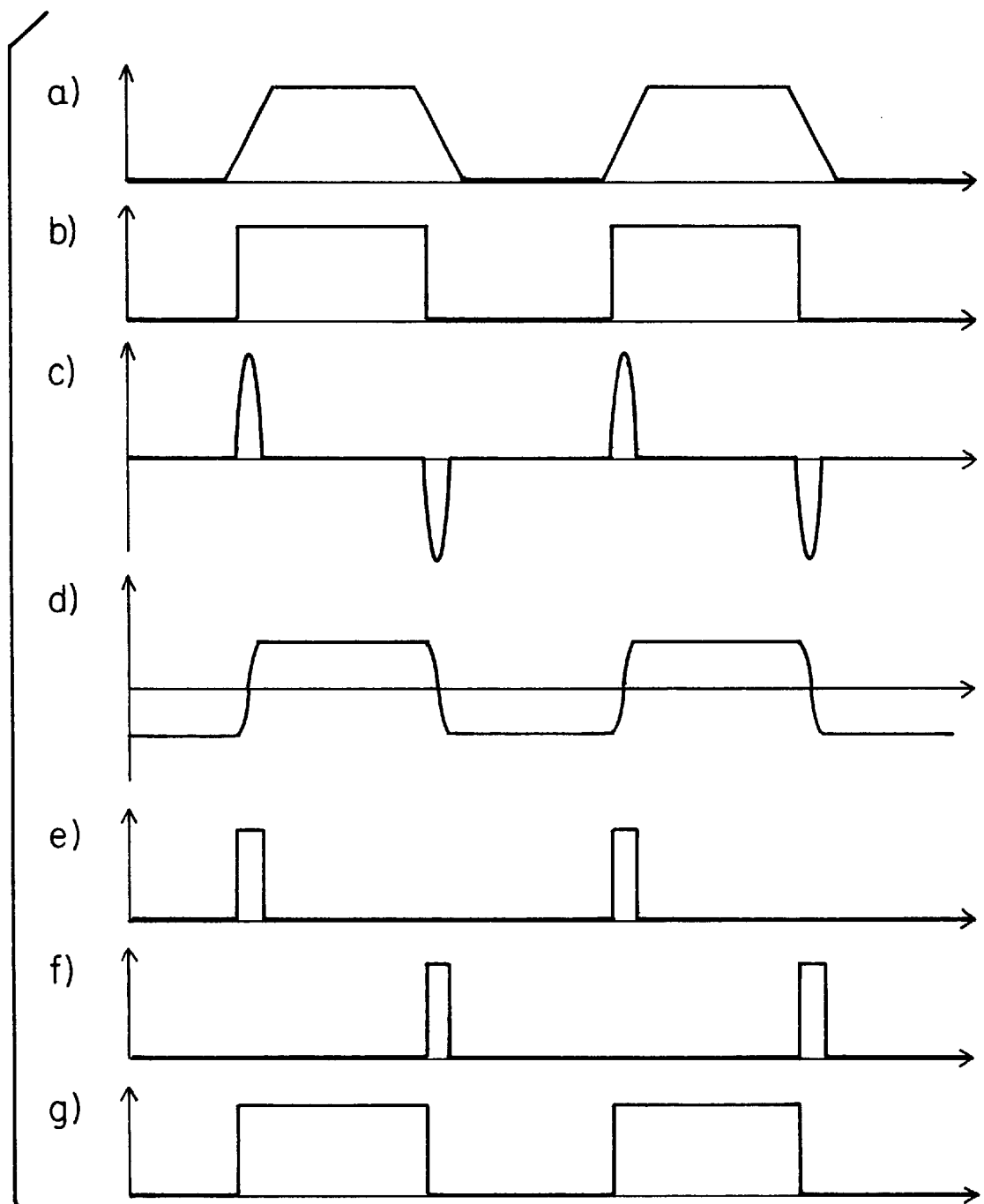
FIG. 9 is a graph representing the signals generated according to the present invention in a time/amplitude diagram.

FIG. 9 explains the mode operation of the embodiment described in FIG. 6. The graph (a) is representative of a typical signal as supplied by the data source. This signal is not processed by the signal processing circuit in the transmitter such that the minimum slope of the signal flanks will be ensured. This signal is represented by graph (b). Downstream of the transmission path with band-pass characteristics the signal presents the shape (c). Now the receiver must reconstruct the original signal via an evaluation circuit. When the signal is then integrated via an integrator, per an embodiment of the invention, the signal shape according to graph (d) is obtained. Using another embodiment of the invention, the evaluation is performed via two comparators and a memory. The graph (e) represents the output signal of the first comparator for detecting positive pulses, while graph (f) shows the output signal of the second comparator for detecting negative pulses. The output signal of the memory is represented by graph (g).

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A system for transmitting and receiving high frequency signals between two parts, where a first part is a movable part and a second part is a stationary part, comprising:
   a signal source, located in the first part, for emitting a signal;
   a signal sink, located in the second part, for receiving the signal;
   a transmission channel, extending between the first part and the second part providing a signal current path for the signal and a defined return current path for a return current of the signal and for connecting the signal source and the signal sink, the signal current path and the defined return current path each comprising a first portion coupled with a second portion; and
   a coupler, provided in the transmission channel for coupling the first portion of the signal current path to the second portion of the signal current path;
   wherein the return current of the signal is returned from the second portion to the first portion along the defined return current path.

2. The system according to claim 1, further comprising:
   a first matching circuit arranged in the first part of the signal current path of the transmission channel; and
   a second matching circuit arranged in the second part of the signal current path of the transmission channel;
   wherein the first matching circuit converts a first unsymmetrical signal transmitted from the signal source into a symmetrical signal, and the second matching circuit converts the symmetrical signal to a second unsymmetrical signal.

3. The system according to claim 2, wherein the first matching circuit and the second matching circuit comprise passive or active components.

4. The system according to claim 3, wherein the passive components comprise a transformer or a line, and the active components comprise a semiconductor or an amplifier.

5. The system according to claim 2, wherein the first and second matching circuits are selected from the group comprising:
   when said first matching circuit is a line having a first impedance and is terminated with a first matching resistor, said second matching circuit is a line having a second impedance and is terminated with a second matching resistor;
   when said first matching circuit is a line having a first impedance, said second matching circuit is a line having a second impedance and is terminated with a matching resistor;
   when said first matching circuit is a transformer, said second matching circuit is a transformer;
   when said first matching circuit is an amplifier, said second matching circuit is a differential amplifier;
   when said first matching circuit is a logic gate, said second matching circuit is a logic circuit.

6. The system according to claim 1, wherein the coupler comprises:
   two first symmetrical conductive surfaces of approximately the same size for transmitting the signal and receiving the return current of the signal; and
   two second symmetrical conductive surfaces of approximately the same size for receiving the signal and transmitting the return current of the signal, disposed in close proximity to the two first symmetrical conductive surfaces so that each transmitting symmetrical conductive surface overlaps and faces a receiving conductive surface, the two first symmetrical conductive surfaces being located in the first part and the two second symmetrical conductive surfaces being located in the second part.

7. The system according to claim 6, wherein the dimensions of the two first symmetrical conductive surfaces are different from those of the two second symmetrical conductive surfaces.

8. The system according to claim 6, wherein the dimensions of the two first symmetrical conductive surfaces are the same as those of the two second symmetrical conductive surfaces.

9. A system for transmitting and receiving high frequency signals between two parts, where a first part is a movable part and a second part is a stationary part, comprising:
   a signal source, located in the first part, for emitting a signal;
   a signal sink, located in the second part, for receiving the signal;
   a transmission channel, extending from the first part to the second part providing a signal current path for the signal and connecting the signal source and the signal sink, the signal current path comprising a line that is terminated on at least one end by an impedance device and having a first portion and a second portion; and
   a coupler, provided in the transmission channel for coupling the signal from the first portion of the signal current path to the second portion of the signal current path;

wherein the impedance device is matched to an impedance of the line to eliminate reflections.

10. The system according to claim 9, further comprising:

at least one of a high-impedance output circuit and a field probe for coupling-out the signal from the line in the first part of the signal current path;

wherein the at least one of the high-impedance output circuit and the field probe does not cause additional reflections on the line.

11. The system according to claim 9, wherein the signal is coupled into contact with the line in the second part of the signal current path.

12. The system according to claim 9, wherein the signal is inductively coupled into the line in the second part of the signal current path via the coupler.

13. A system for transmitting and receiving high frequency signals between two parts, where a first part is a movable part and a second part is a stationary part, comprising:

a signal source, located in the first part, for emitting a signal;

a signal sink, located in the second part, for receiving the signal;

a transmission channel, extending between the first part and the second part, providing a signal current path for the signal and a defined return current path for a return current of the signal and for connecting the signal source and the signal sink, the signal current path having a line that is terminated on at least one end by an impedance device and the signal current path and the defined return current path each comprising a first portion coupled with a second portion; and a coupler, provided in the transmission channel for coupling the first portion of the signal current path to the second portion of the signal current path;

wherein the return current of the signal is returned from the second portion to the first portion along the defined return current path, and the impedance device is matched to an impedance of the line to eliminate reflections.

* * * * *